United States Patent
Park

(10) Patent No.: US 8,400,580 B2
(45) Date of Patent: Mar. 19, 2013

(54) BACKLIGHT UNIT AND LIQUID CRYSTAL DISPLAY DEVICE HAVING THE SAME

(75) Inventor: Jae Sung Park, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 677 days.

(21) Appl. No.: 12/591,899

(22) Filed: Dec. 3, 2009

(65) Prior Publication Data

US 2011/0025949 A1    Feb. 3, 2011

(30) Foreign Application Priority Data

Jul. 29, 2009   (KR) .................. 10-2009-0069704

(51) Int. Cl.
    *G02F 1/1335*   (2006.01)
(52) U.S. Cl. ............ 349/64; 349/65; 362/602; 362/612
(58) Field of Classification Search .................... 349/64, 349/65; 362/602, 612
    See application file for complete search history.

(56) References Cited

U.S. PATENT DOCUMENTS

| | | | |
|---|---|---|---|
| 2008/0094855 A1* | 4/2008 | Yu et al. | 362/634 |
| 2008/0101084 A1* | 5/2008 | Hsu | 362/612 |
| 2008/0232134 A1* | 9/2008 | Weng et al. | 362/612 |
| 2011/0013377 A1* | 1/2011 | Kim | 362/97.1 |
| 2011/0134371 A1* | 6/2011 | Shimojoh et al. | 349/65 |

FOREIGN PATENT DOCUMENTS

| | | |
|---|---|---|
| CN | 1316871 A | 10/2001 |
| CN | 101126867 A | 2/2008 |
| CN | 101377586 A | 3/2009 |

* cited by examiner

*Primary Examiner* — Huyen Ngo

(74) *Attorney, Agent, or Firm* — McKenna Long & Aldridge, LLP

(57) ABSTRACT

A backlight unit capable of preventing a light leakage phenomenon caused by using a light guide plate of wedge type is disclosed. The backlight unit includes: at least one light source; a light guide plate configured to include a first portion with a first thickness disposed adjacent to the at least one light source, a second portion of plate shape having a second thickness thinner than the first thickness, and a wedge portion formed to connect the first and second portions and become gradually thinner from the first portion to the second portion; and a flexible printed circuit board loaded with the at least one light source and extended to cover the wedge portion of the light guide plate. The flexible printed circuit board is provided with a groove formed opposite a boundary area between the first portion and the wedge portion.

12 Claims, 5 Drawing Sheets

BACKLIGHT UNIT AND LIQUID CRYSTAL DISPLAY DEVICE HAVING THE SAME

CROSS-REFERENCE TO RELATED APPLICATION

This application claims priority under 35 U.S.C. 119 to Korean Patent Application No. 10-2009-0069704, filed on Jul. 29, 2009, which is hereby incorporated by reference in its entirety.

BACKGROUND

1. Field of the Disclosure

This disclosure relates to a backlight unit, and more particularly to a backlight unit adapted to prevent light leakage caused by a light guide plate of wedge type and a liquid crystal display device having the same.

2. Description of the Related Art

Recently, personal mobile terminals have been rapidly researched and developed. Mobile terminals such as notebook (or lap-top) computers and personal digital assistants (PDAs) have been applied to electronic data processing systems (EDPSs). Moreover, mobile terminals such as cellular phones and navigation systems being of specialized uses have been widely spread.

With the most recent development of electro-communication technologies, the performance of mobile terminals has been rapidly enhanced. For example, cellular phones have been improved so that they can connect to the interne and include a digital camera. As such, the cellular phones can take still and moving pictures and send these pictures by radio. Furthermore, cellular phones are improving enough to be employed for a small-sized database, which makes it possible to manage schedules and edit/store documents.

Such mobile terminals make use of liquid crystal display (LCD) devices which can be provided with superior contrast and color reproduction and manufactured in large quantities, in order to configure a display screen. The LCD devices are widening their application fields as a result of their features, such as their light weight, slimness, low driving voltage, and so on. This trend is evident in the ways in which the LCD devices have been applied to office automation equipment, audio equipment, video equipment, and more.

The LCD device controls a transmitting amount of light on the basis of image signals applied to a plurality of control switches, in order to display a picture. The LCD devices are not self-illuminating display devices. In accordance therewith, an LCD device includes a backlight unit provided on the rear surface of an LCD panel which displays images.

FIG. 1 is a planar view showing an image display portion included in a cellular phone or a mobile terminal of related art. FIG. 2 is a cross-sectional view showing an LCD device included in a cellular phone or a mobile terminal of related art. As shown in FIGS. 1 and 2, a cellular phone or a mobile terminal of the related art includes a display portion 5 configured to display images and a body portion configured to have a key pad and a variety of menu keys which are not shown in the drawings.

The display portion 5 includes a case 15, a small-sized LCD device 8, and a window plate (not shown). The case 15 is formed to have an opening OP which allows images to be viewed through it. The LCD device 8 is disposed into the inner side of the case 15 and displays images to be viewed through the opening OP. The window plate projects the images displayed on the LCD device 8 and protects a display area of the LCD device 8.

The small-sized LCD device 8 included in the cellular phone or the mobile terminal is configured to include an LCD panel 10, a backlight unit 70, a support main 30, and a bottom cover 35. The backlight unit 70 and the support main 30 are disposed under the LCD panel 10. The bottom cover 35 is formed to surround the lower and side surfaces of the support main 30. Such an LCD device 8 is manufactured in a size small enough to be used in the portable cellular phone or the portable mobile terminal. As such, a top case encompassing the edges of the LCD panel 10 is removed from the LCD device 8. The edges of the backlight unit 70 and the LCD panel 10 are encompassed by the support main 30. The bottom cover 35 prevents a breakaway of the backlight unit 70.

The support main 30 is formed in a rectangular rim shape. The support main 30 is provided with at least one light source 45, a reflection sheet 55, a light guide plate 40, and optical sheets 60. At least one light source 45 is disposed on at least one inner sidewall surface of the support main 30. The reflection sheet 55 is disposed on the rear surface of the support main 30. The light guide plate 40 and the optical sheets 60 are sequentially disposed on the reflection sheet 55.

The light source 45 is also disposed parallel to a side surface of the light guide plate 40. The light source 45 is mounted on a first flexible printed circuit board (PCB) 50 which is connected to a backlight driving circuit (not shown). The backlight driving circuit generates a driving signal used for driving the light source 45.

The LCD panel 10 is placed on the backlight unit 70. An edge of the LCD panel 10 is connected to a PCB (not shown) via a second flexible PCB 13. The PCB loads driver circuits. The LCD panel 10 includes a thin film transistor substrate 23 and a color filter substrate 20. The LCD panel 10 further includes polarizing plates 27 and 29 each attached to a lower surface of the thin film transistor substrate 23 and an upper surface of the color filter substrate 20.

The small-sized LCD device 8 uses high-brightness light emission diodes that are smaller and thinner than a fluorescent lamp and configures the light source 45. An edge of the light guide plate 40 adjacent to the light source 45 becomes thickest, and the remaining portion of the light guide plate 40 is formed in a thinner plate shape than the adjacent edge to the light source 45. In other words, the light guide plate 40 is formed in a wedge type (i.e., to have a wedge portion "wgA").

Such a structure of the light guide plate 40 allows the optical sheets 60 to be disposed on the thin portion of the light guide plate 40. As such, the entire thickness of the LCD device 8 can be reduced.

However, the LCD device 8 with the light guide plate 40 of wedge type causes a light leakage phenomenon which forces the brightness of a part of the image display area AA adjacent to the wedge portion "wgA" of the light guide plate 40 and the light source 45 to become brighter than that of the rest of the image display area. Due to this, the picture quality of the LCD device 8 is deteriorated.

BRIEF SUMMARY

Accordingly, the present embodiments are directed to a backlight unit that substantially obviates one or more of problems due to the limitations and disadvantages of the related art, and an LCD device with the same.

An object of the present embodiment is to provide a backlight unit that is adapted to prevent a light leakage phenomenon so as to enhance picture quality, and an LCD device with the same.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a backlight unit includes: at least one light source; a light guide plate configured to include a first portion with a first thickness disposed adjacent to the at least one light source, a second portion of plate shape having a second thickness thinner than the first thickness, and a wedge portion formed to connect the first and second portions and become gradually thinner from the first portion to the second portion; and a flexible printed circuit board loaded with the at least one light source and extended to cover the wedge portion of the light guide plate, wherein the flexible printed circuit board is provided with a groove formed opposite a boundary area between the first portion and the wedge portion.

An LCD device according to another aspect of the present embodiment includes: a liquid crystal display panel; at least one light source configured to apply light to the liquid crystal display panel; a light guide plate configured to include a first portion with a first thickness disposed adjacent to the at least one light source, a second portion of plate shape having a second thickness thinner than the first thickness, and a wedge portion formed to connect the first and second portions and become gradually thinner from the first portion to the second portion; and a flexible printed circuit board loaded with the at least one light source and extended to cover the wedge portion of the light guide plate. The flexible printed circuit board is provided with a groove formed opposite a boundary area between the first portion and the wedge portion.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
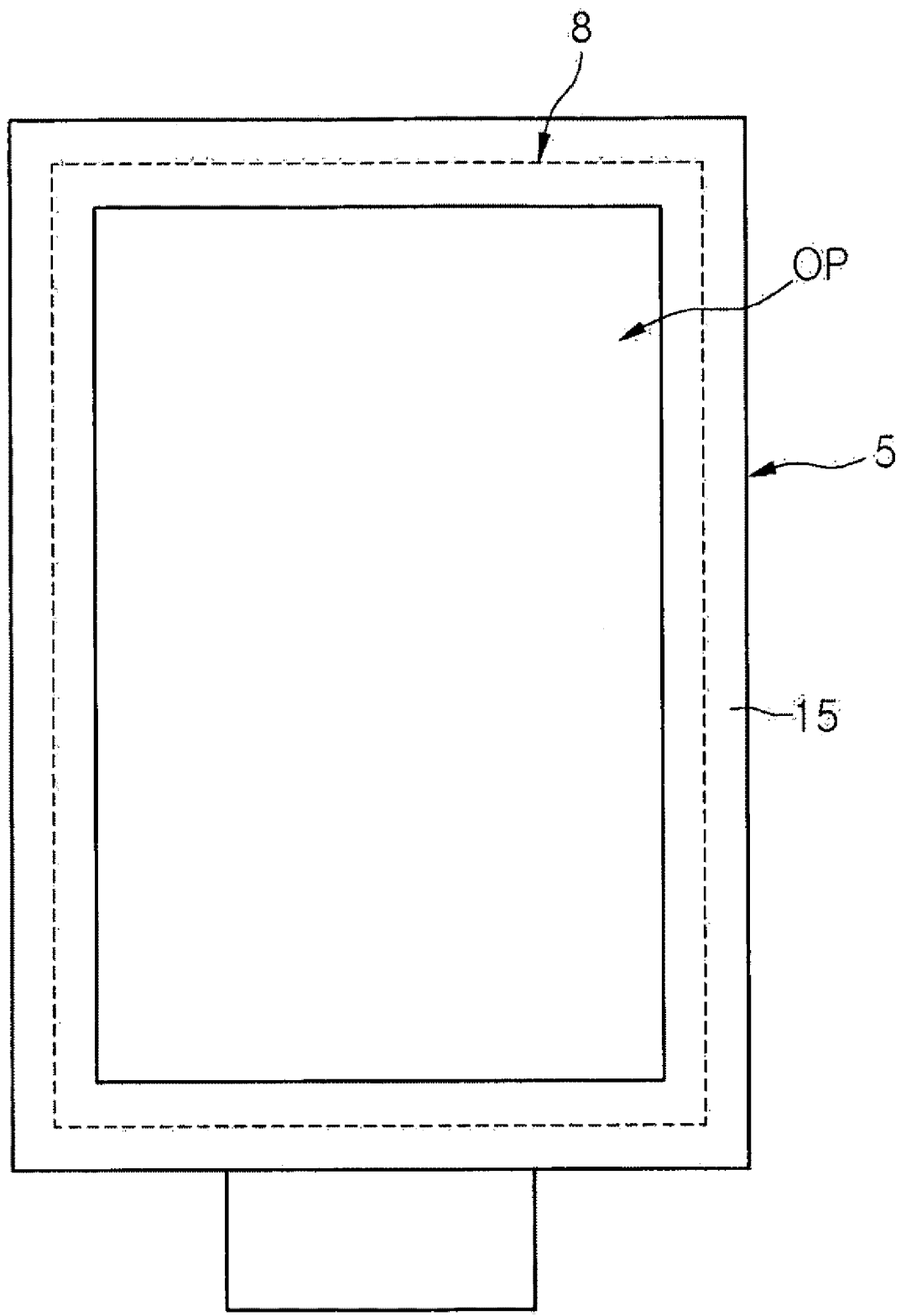
FIG. 1 is a planar view showing an image display portion included in a cellular phone or a mobile terminal of related art.
Figure 2:
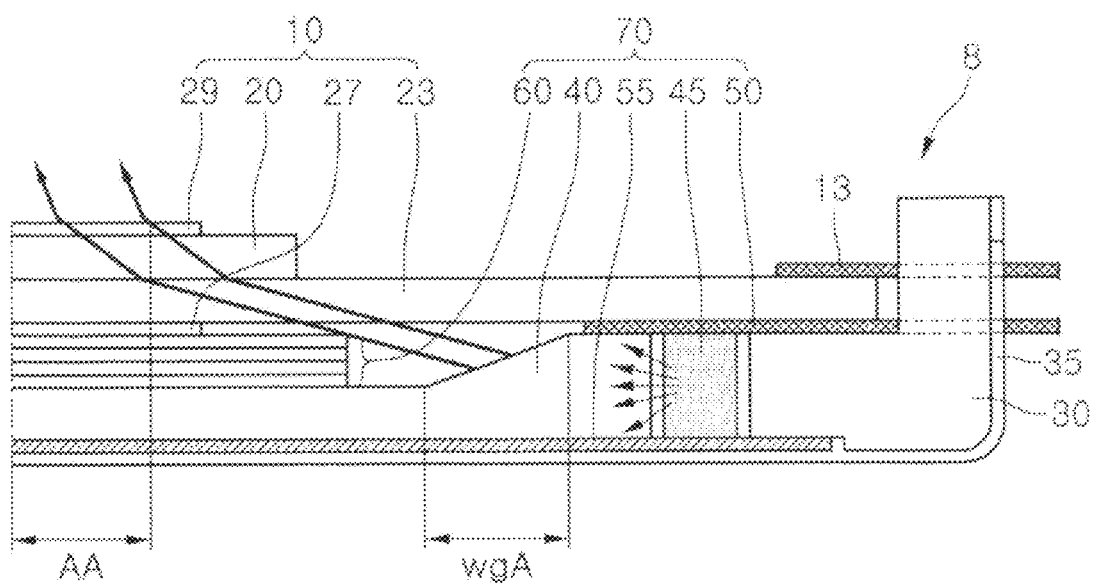
FIG. 2 is a cross-sectional view showing an LCD device included in a cellular phone or a mobile terminal of related art.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 3:
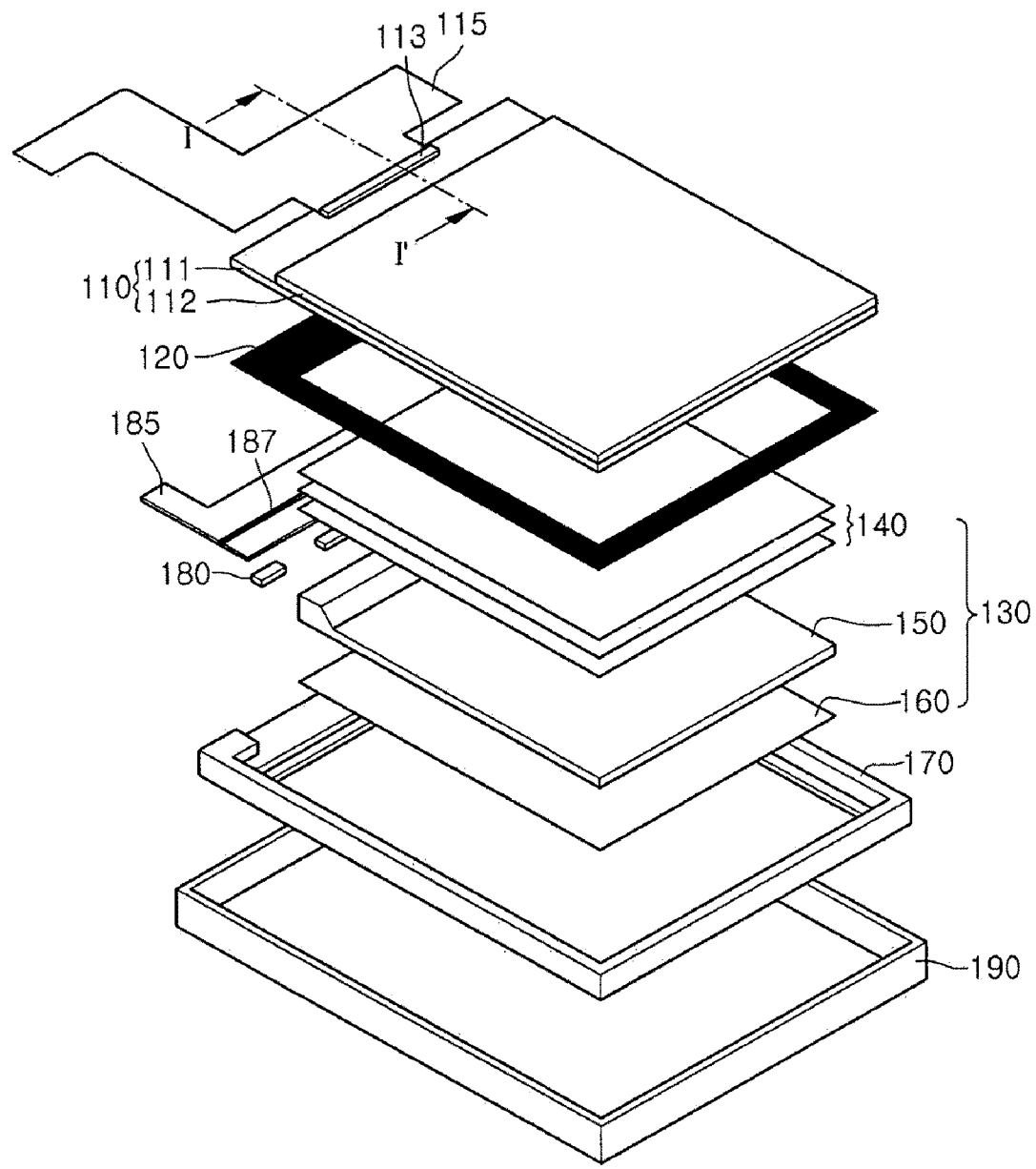
FIG. 3 is a disassembled perspective view showing a small-sized LCD device according to an embodiment of the present disclosure.
Figure 4:
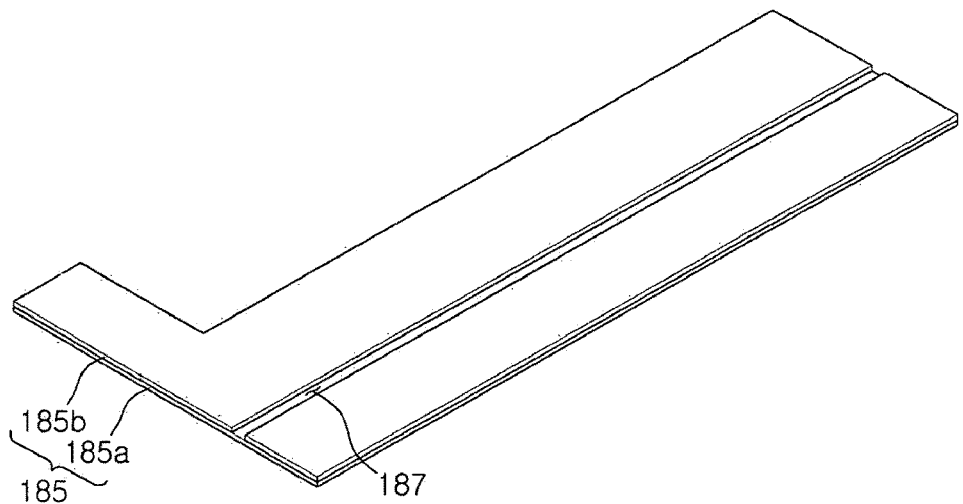
FIG. 4 is a perspective view showing in detail a second flexible printed circuit board according to an embodiment of the disclosure.
Figure 5:
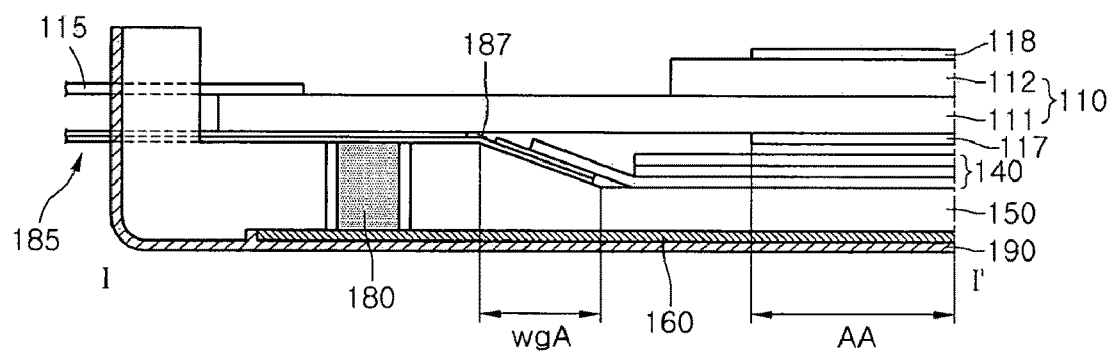
FIG. 5 is a cross-sectional view showing a small-sized LCD device taken along a line I-I' in FIG. 3.

FIG. 3 is a disassembled perspective view showing a small-sized LCD device according to an embodiment of the present disclosure. FIG. 4 is a perspective view showing in detail a second flexible printed circuit board according to an embodiment of the disclosure. FIG. 5 is a cross-sectional view showing a small-sized LCD device taken along a line I-I' in FIG. 3.

Referring to FIGS. 3 to 5, a small-sized LCD device according to an embodiment of the present disclosure includes an LCD panel 110, a backlight unit 130, a support main 170, and a bottom cover 190. The LCD panel 110 is configured to display images. The backlight unit 130 is disposed on a lower surface of the LCD panel 110 in order to irradiate light onto the LCD panel 110. The support main 170 is configured to receive the backlight unit 130 and support the edges of the LCD panel 110. The bottom cover 190 is configured to encompass the lower and side surfaces of the support main 170 into which the backlight unit 130 is received.

The LCD panel 110 includes a thin film transistor substrate 111 and a color filter substrate 112 opposite each other, and a liquid crystal layer (not shown) interposed between the two substrates 111 and 113. The thin film transistor substrate 111 and the color filter substrate 112 are combined to maintain a uniform cell gap. The LCD panel 110 further includes polarizing plates (not shown) each attached onto the upper surface of the color filter substrate 112 and the lower surface of the thin film transistor substrate 111.

The thin film transistor substrate 111 and the color filter substrate 112 will now be described, even though they are not shown in detail in the drawings. The thin film transistor substrate 111 includes a plurality of gate lines and a plurality of data lines arranged to cross each other and define pixels, and thin film transistors each formed at each of the intersections of the plurality of gate and data lines. The thin film transistors are connected to pixel electrodes which are included in the pixels, respectively. The color filter substrate 112 includes red, green, and blue color filters, a black matrix, and a common electrode. The red, green, and blue color filters are formed opposite the pixels, respectively. The black matrix is formed to cover the edges of the color filters and screen the gate lines, the data lines, and the thin film transistors. The common electrode is formed to cover the color filters and the black matrix.

The LCD device further includes a first flexible PCB 115 attached to an edge of the LCD panel 110. The first flexible PCB 115 transfers external data and control signals to the LCD panel 110. To this end, the first flexible PCB is configured to include a complex wiring circuit formed on a flexible insulation film. The flexible insulation film is formed from a heat resistant plastic material such as polyester (PET), polyimide (PI), or others. Such a first flexible PCB 115 is greatly used in small-sized LCD devices because of its flexibility in allowing the effective use of space and three dimensional wiring to be provided.

Moreover, driver circuit 113 is mounted on the first flexible PCB 115 which is connected to an edge of the LCD panel 10. The driver circuit 113 responds to the external signals applied through the first flexible PCB 115 and generates driving signals used for driving the LCD panel 110.

The backlight unit 130 applying light to the LCD panel 110 includes a plurality of LEDs 180 arranged on an inner side edge of the support main 170 which is encompassed by the bottom cover 190 with the opened upper surface, a second flexible PCB 185 loaded with the plurality of LEDs 185, and a light guide plate 150 disposed parallel to the plurality of LEDs 180. The second flexible PCB 185 is configured to transfer signals for driving the plurality of LEDs 180. Also, the backlight unit 130 includes optical sheets 140 sequentially stacked on the light guide plate 150, and a reflection sheet 160 disposed under the light guide plate 150. The optical sheets 140 disperse and converge light from the light guide plate 150. The reflection sheet 160 is configured to reflect light progressing downward from the light guide plate 150 toward the optical sheets 140, thereby reducing light leakage.

The support main 170 is configured to prevent a breakaway of the plurality of LEDs 180, the second flexible PCB 185, the light guide plate 150, the optical sheet 140, and the reflection sheet 160 from desired positions. Also, the support main 170 loads a shading tape 120 used for fixing the LCD panel 110.

The shading tape 120 includes adhesive layers coated on both sides and secures the backlight unit 130 and the LCD panel 110 to the support main 170. The shading tape 120 is entirely formed in black color and prevents light generated in the backlight unit 130 from leaking toward the exterior. When the backlight unit 130 and the LCD panel 110 are combined with the support main 170 by the shading tape 120, the first flexible PCB 115 is set at an angle of 180° and disposed on the lower surface of the support main 170.

The light guide plate 150 adjacent to the plurality of LEDs 180 in the small-sized LCD device according to an embodiment of the present disclosure is formed in a wedge shape (or type) which has an edge portion thicker than those of the remaining portions. More specifically, the light guide plate 150 is configured to include into a first portion adjacent to the plurality of LEDs 180, a second portion with the thinnest thickness, and a third portion connecting the first and second portions. The first portion is formed to be thickest. The second portion is formed in a thin plate shape. The third portion can be defined in a wedge portion "wgA" which gradually becomes thinner as it goes from the first portion to the second portion. Such a light guide plate 150 is formed from poly methyl methacrylate (PMMA).

The second flexible PCB 185 loaded with the plurality of LEDs 180 on its one surface includes wiring which is prepared on the other surface and transfers the driving signals to the plurality of LEDs 180. To this end, the second flexible PCB 185 is configured to include a base layer 185a formed from a heat resistant plastic film such as polyester (PET) or polyimide (PI) having flexibility, and a wiring layer 185b formed to have a plurality of wiring on the base layer 185a. In other words, one surface of the second flexible PCB 185 can correspond to the base layer 185a, and the other surface of the second flexible PCB 185 can become the wiring layer 185b.

Also, the second flexible PCB 185 is provided with a groove 187 formed parallel to an arranged direction of the LEDs 180. Actually, the plurality of LEDs 180 are arranged along a line direction of the second flexible PCB 185. The groove 187 is formed on one surface of the second flexible PCB 185, opposite to the other surface loaded with the plurality of LEDs 180, without breaking down. The groove 187 is prepared by removing the wiring layer 185b of the second flexible PCB 185. In other words, the groove 187 includes a bottom surface consisting of the base layer 185a.

Such a groove 187 is opposite a boundary area between the first portion with the thickest and the wedge portion, when the second flexible PCB 185 is attached to the light guide plate 150 and the support main 170. As such, the second flexible PCB 185 is not lifted off by its elastic strength. In other words, the groove 187 suppresses the elastic strength of the second flexible PCB 185, thereby preventing the lifting off of the second flexible PCB 185 from the wedge portion wgA of the light guide plate 150.

Furthermore, the second flexible PCB 185 provided with the groove 187 is extended enough to cover the wedge portion wgA of the light guide plate 150 and comes in close contact with the light guide plate 150 and the support main 170. Moreover, an end portion of the second flexible PCB 185 on the wedge portion wgA of the light guide plate 150 is disposed under a portion of a diffusion sheet which is included in the optical sheets 140 and placed directly on the light guide plate 150. The portion of the diffusion sheet disposed on the end portion of the second flexible PCB 150 additionally suppresses the elastic strength of the second flexible PCB 150. As such, the second flexible PCB 185 can be more difficult to lift off by its elastic strength.

In this manner, the small-sized LCD device according to an embodiment of the present disclosure includes the second flexible PCB 150 of which an edge portion is extended (to cover the wedge portion wgA of the light guide plate 150. Therefore, it prevents a light leakage phenomenon which transmits light at higher brightness through an edge region of display area adjacent to the wedge portion wgA rather than the remaining display area. As a result, the deterioration of picture quality in the small-sized LCD device can be prevented.

Also, the small-sized LCD device of the present embodiment allows the groove 187 to be formed on a surface of the second flexible PCB 185, which is opposite to a boundary area between the first portion with the thickest thickness and the wedge portion wgA of the light guide plate 150, by removing the wiring layer 185b. As such, the lift off of the second flexible PCB is difficult as a result of its elastic strength. Accordingly, it substantially prevents the light leakage phenomenon wherein light is transmitted at higher brightness through an edge region of display area adjacent to the wedge portion wgA rather than the remaining display area. As a result, the deterioration of picture quality in the small-sized LCD device can be substantially prevented.

Moreover, the small-sized LCD device of the present embodiment forces a portion of the diffusion sheet on the light guide plate 150 to be disposed on the edge portion of the second flexible PCB 185 which is placed on the wedge portion wgA of the light guide plate 150. As such, the lift off of the second flexible PCB 185 from the wedge portion of the light guide plate 150 can be hardly caused by its elastic strength. Accordingly, the light leakage phenomenon in the small-sized LCD device can be completely prevented.

Figure 6:
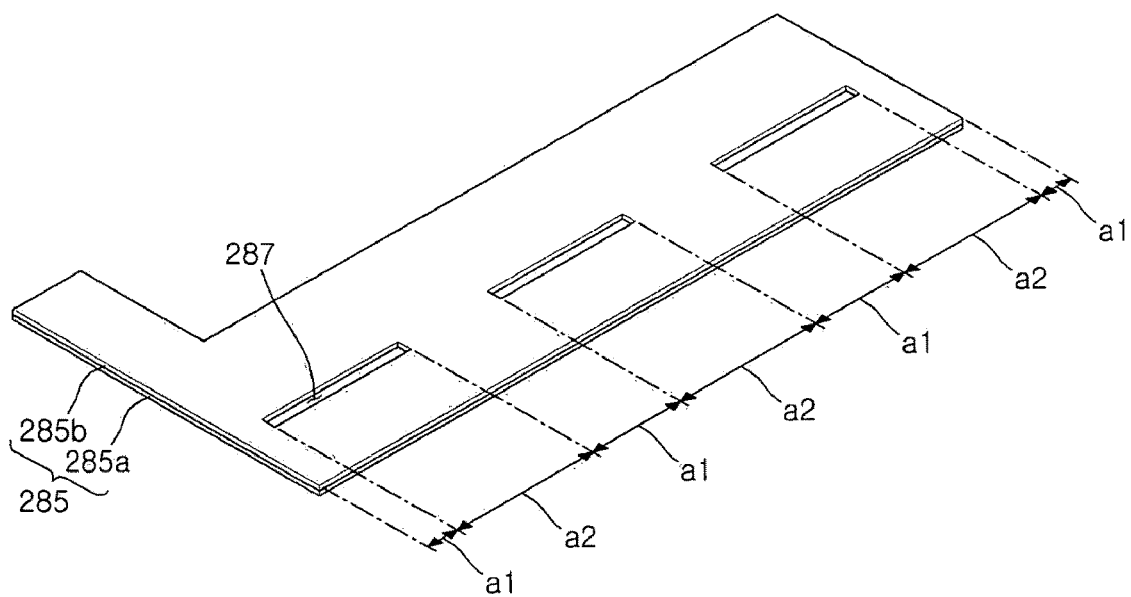
FIG. 6 is a perspective view showing in detail a second flexible printed circuit board according to another embodiment of the disclosure.

FIG. 6 is a perspective view showing in detail a second flexible printed circuit board according to another embodiment of the disclosure.

As shown in FIG. 6, a second flexible PCB 285 according to another embodiment of the present disclosure includes a base layer 285a of film shape formed from a flexible, heat resistant plastic material such as polyester or polyimide, and a wiring layer 285b formed to include a plurality of wirings on the base layer 285b. In other words, one surface of the second flexible PCB 285 corresponds to the base layer 285a, and the other surface of the second flexible PCB 285 becomes the wiring layer 285b.

The second flexible PCB 285 is provided with a plurality of grooves 287 formed separately at fixed intervals from one another on one side not loaded with the plurality of LEDs 180. The plurality of grooves 287 are formed along a long direction of the second flexible PCB 285. The plurality of grooves 287 are opposite to a boundary area between the first portion with the thickest thickness and the wedge portion wgA which are included in the light guide plate 150 shown in FIG. 5. Interval regions between the plurality of grooves 287 will be referred to as first regions a1, and groove regions occupied by the grooves will be referred to as second regions a2.

The first regions a1 can be necessary to form wiring for transferring the driving signals to the plurality of LEDs 180 on the lower surface of the second flexible PCB 285, according to design specifications. As such, the second regions (i.e., the groove regions) a2 provided opposite the boundary area between the thickest portion and the wedge portion wgA of the light guide plate 150 can be adjusted in number and length according to wiring design specifications of the second flexible PCB 285. In other words, the number and length of first regions a1 (i.e., interval regions) can also be adjusted along the wiring design specifications of the second flexible PCB 285.

Moreover, the second flexible PCB 285 provided with the plurality of grooves (or slits) 287 is extended enough to cover the wedge portion wgA of the light guide plate 150. As such, the light leakage phenomenon transmitting light at higher brightness through an edge region of display area adjacent to the wedge portion wgA rather than the remaining display area can be prevented. Accordingly, the deterioration of picture quality in the small-sized LCD device can be prevented.

As described above, the second flexible PCB 285 according to another embodiment of the present disclosure is provided with the plurality of grooves 287 which are formed opposite to a boundary area between the thickest portion and the wedge portion (wgA in FIG. 5) of the light guide plate (150 in FIG. 5) by removing the wiring layer 285b. As such, it is difficult for the lift off of the second flexible PCB 285 to be caused by its elastic strength. Accordingly, it substantially prevents the light leakage phenomenon where light is transmitted at a higher brightness through an edge region of display area adjacent to the wedge portion wgA rather than the remaining display area. As a result, the deterioration of picture quality in the small-sized LCD device can be substantially prevented.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A backlight unit comprising:
   at least one light source;
   a light guide plate configured to include a first portion with a first thickness disposed adjacent to the at least one light source, a second portion of plate shape having a second thickness thinner than the first thickness, and a wedge portion formed to connect the first and second portions and become gradually thinner from the first portion to the second portion; and
   a flexible printed circuit board loaded with the at least one light source and extended to cover the wedge portion of the light guide plate,
   wherein the flexible printed circuit board is provided with a groove formed opposite a boundary area between the first portion and the wedge portion.

2. The backlight unit according to claim 1, wherein the groove is formed along a direction parallel to the light source without breaking off.

3. The backlight unit according to claim 1, wherein the flexible printed circuit board includes:
   a base layer formed from a flexible plastic material; and
   a wiring layer formed on the base layer and configured to apply a driving signal to the light source.

4. The backlight unit according to claim 3, wherein the groove is formed to expose the base layer by partially removing the wiring layer.

5. The backlight unit according to claim 1, wherein the flexible printed circuit board is configured to include an edge portion placed between the wedge portion and a side portion of a diffusion sheet which is disposed on the light guide plate.

6. The backlight unit according to claim 1, wherein the groove is formed to include a plurality of short grooves separated at fixed intervals from one another.

7. A liquid crystal display device comprising:
   a liquid crystal display panel;
   at least one light source configured to apply light to the liquid crystal display panel;
   a light guide plate configured to include a first portion with a first thickness disposed adjacent to the at least one light source, a second portion of plate shape having a second thickness thinner than the first thickness, and a wedge portion formed to connect the first and second portions and become gradually thinner from the first portion to the second portion; and
   a flexible printed circuit board loaded with the at least one light source and extended to cover the wedge portion of the light guide plate,
   wherein the flexible printed circuit board is provided with a groove formed opposite a boundary area between the first portion and the wedge portion.

8. The liquid crystal display device according to claim 7, wherein the groove is formed along a direction parallel to the light source without breaking off.

9. The liquid crystal display device according to claim 7, wherein the flexible printed circuit board includes:
   a base layer formed from a flexible plastic material; and
   a wiring layer formed on the base layer and configured to apply a driving signal to the light source.

10. The liquid crystal display device according to claim 9, wherein the groove is formed to expose the base layer by partially removing the wiring layer.

11. The liquid crystal display device according to claim 7, wherein the flexible printed circuit board is configured to include an edge portion placed between the wedge portion and a side portion of a diffusion sheet which is disposed on the light guide plate.

12. The liquid crystal display device according to claim 7, wherein the groove is formed to include a plurality of short grooves separated at fixed intervals from one another.

* * * * *